(12) United States Patent
Yazaki

(10) Patent No.: US 10,879,142 B2
(45) Date of Patent: Dec. 29, 2020

(54) ELECTRONIC COMPONENT

(71) Applicant: Murata Manufacturing Co., Ltd., Nagaokakyo (JP)

(72) Inventor: Hirokazu Yazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 69 days.

(21) Appl. No.: 16/407,257

(22) Filed: May 9, 2019

(65) Prior Publication Data

US 2019/0267301 A1   Aug. 29, 2019

Related U.S. Application Data

(63) Continuation of application No. PCT/JP2017/040504, filed on Nov. 10, 2017.

(30) Foreign Application Priority Data

Dec. 5, 2016   (JP) .................................. 2016-235678

(51) Int. Cl.
*H01L 23/552*   (2006.01)
*H01L 23/31*   (2006.01)
(Continued)

(52) U.S. Cl.
CPC .......... *H01L 23/3107* (2013.01); *H01L 23/29* (2013.01); *H01L 23/3135* (2013.01); *H01L 23/49805* (2013.01); *H01L 23/552* (2013.01); *H05K 1/0218* (2013.01); *H05K 1/18* (2013.01); *H05K 3/4007* (2013.01); *H05K 9/0075* (2013.01); *H05K 2201/08* (2013.01)

(58) Field of Classification Search
CPC ............... H01L 24/97; H01L 27/14623; H01L 2924/181; H01L 2924/3025; H01L 23/552; H01L 2224/97; H01L 2924/19105
USPC ........................................ 257/659, 704, 787
See application file for complete search history.

(56) References Cited

U.S. PATENT DOCUMENTS 8,093,691 B1 * 1/2012 Fuentes ............... H01L 23/3128
257/660
2005/0116255 A1 * 6/2005 Kato ...................... H01L 23/552
257/200

(Continued)

FOREIGN PATENT DOCUMENTS

JP   05-95197 A   4/1993
JP   08-37394 A   2/1996
(Continued)

OTHER PUBLICATIONS

Official Communication issued in International Patent Application No. PCT/JP2017/040504, dated Jan. 23, 2018.

*Primary Examiner* — S. V. Clark
(74) *Attorney, Agent, or Firm* — Keating & Bennett, LLP

(57) ABSTRACT

An electronic component includes a board, a surface mount device, a nonmagnetic resin layer, a metal shield layer, and a magnetic shield layer. The board includes first and second principal surfaces facing each other, and a magnetic body layer. The surface mount device is mounted on the first principal surface of the board. The nonmagnetic resin layer covers the surface mount device. The metal shield layer covers the nonmagnetic resin layer. The magnetic shield layer covers an entire or substantially an entire surface of the metal shield layer.

18 Claims, 6 Drawing Sheets

(51) Int. Cl.
*H01L 23/29* (2006.01)
*H01L 23/498* (2006.01)
*H05K 1/02* (2006.01)
*H05K 1/18* (2006.01)
*H05K 3/40* (2006.01)
*H05K 9/00* (2006.01)

(56) References Cited

U.S. PATENT DOCUMENTS

| | | | |
|---|---|---|---|
| 2006/0019422 A1* | 1/2006 | Tuttle | H01L 23/3107 438/55 |
| 2013/0256819 A1 | 10/2013 | Watanabe et al. | |
| 2017/0278804 A1 | 9/2017 | Kawabata et al. | |
| 2017/0294387 A1 | 10/2017 | Kawabata et al. | |
| 2018/0033738 A1* | 2/2018 | Kawabata | H01L 24/16 |
| 2019/0363030 A1* | 11/2019 | Yazaki | H05K 3/284 |

FOREIGN PATENT DOCUMENTS

| | | |
|---|---|---|
| JP | 09-116289 A | 5/1997 |
| JP | 2010-087058 A | 4/2010 |
| JP | 2013-207059 A | 10/2013 |
| JP | 5988003 B1 | 9/2016 |
| JP | 5988004 B1 | 9/2016 |

* cited by examiner

ELECTRONIC COMPONENT

CROSS REFERENCE TO RELATED APPLICATIONS

This application claims the benefit of priority to Japanese Patent Application No. 2016-235678 filed on Dec. 5, 2016 and is a Continuation Application of PCT Application No. PCT/JP2017/040504 filed on Nov. 10, 2017. The entire contents of each of these applications are hereby incorporated herein by reference.

BACKGROUND OF THE INVENTION

1. Field of the Invention

The present invention relates to an electronic component including a circuit board, a surface mount device mounted on the circuit board, and a shield that covers a surface of the circuit board.

2. Description of the Related Art

Electronic components in which various types of surface mount devices are mounted on boards have been frequently used in electronic devices. For example, Japanese Patent No. 5988003 and Japanese Patent No. 5988004 each describe an electronic circuit package as an electronic component.

The electronic component (electronic circuit package) described in Japanese Patent No. 5988003 includes a board, a plurality of surface mount devices, a mold resin, a magnetic film, and a metal film.

The plurality of surface mount devices are mounted on a surface of the board. The mold resin covers the surface of the board, and the magnetic film covers at least an upper surface of the mold resin. The metal film covers the magnetic film and the mold resin.

Similar to the electronic component described in Japanese Patent No. 5988003, the electronic component (electronic circuit package) described in Japanese Patent No. 5988004 includes a board, a plurality of surface mount devices, a mold resin, a magnetic film, and a metal film. The basic structure thereof is the same as the basic structure of the electronic circuit package described in Japanese Patent No. 5988003. In the electronic component described in Japanese Patent No. 5988004, further, the metal film covers the mold resin, and the magnetic film is disposed on a surface of a portion of the metal film that is close to an IC chip that tends to be influenced by noise.

Such an electronic component in which anti-noise measures are taken is mounted on a base circuit board of the electronic device, and the metal film is connected to a ground conductor of the base circuit board.

However, in the structures described in Japanese Patent No. 5988003 and Japanese Patent No. 5988004, noise that is produced by the surface mounting devices sometimes cannot be effectively reduced or prevented.

Specifically, noise that is produced by each surface mount device includes high frequency components (high frequency noise) and low frequency components (low frequency noise). Of these, the low frequency noise tends to pass around into the electronic component.

Ordinarily, ground terminals of the surface mount devices are connected to ground conductors of the base circuit board. Therefore, the ground terminals of the surface mount devices and the metal film are connected to each other via the ground conductors of the base circuit board. Consequently, the low frequency noise produced by each surface mount device propagates to the metal film via the ground conductors of the base circuit board and is radiated out of the metal film. Particularly, the amplitude of the low frequency noise that flows to the ground conductors of the base circuit board tends to be large, and such a low frequency noise having a large amplitude is radiated to the outside.

SUMMARY OF THE INVENTION

Preferred embodiments of the present invention provide electronic components in each of which radiation of low frequency noise from the electronic component is reduced or prevented.

An electronic component according to a preferred embodiment of the present invention includes a board, a surface mount device, a nonmagnetic resin layer, a metal shield layer, and a magnetic shield layer. The board includes a first principal surface and a second principal surface facing each other, and a magnetic body layer. The surface mount device is mounted on the first principal surface of the board. The nonmagnetic resin layer covers, at the first principal surface, an entire or substantially an entire surface of the surface mount device. The metal shield layer covers, at the first principal surface, the nonmagnetic resin layer. The magnetic shield layer covers, at the first principal surface, an entire or substantially an entire surface of the nonmagnetic resin layer and an entire or substantially an entire surface of the metal shield layer.

In this structure, since the surface mount device is surrounded by the magnetic shield layer and the magnetic body layer of the board, radiation of low frequency noise that is produced from the surface mount device to the outside is reduced or prevented. Radiation to the outside of low frequency noise that has passed around into the metal shield layer via, for example, a base circuit board on which the electronic component is mounted is also reduced or prevented by the magnetic shield layer. Note that radiation of high frequency noise to the outside is reduced or prevented by the metal shield layer.

In an electronic component according to a preferred embodiment of the present invention, it is preferable that the metal shield layer covers, at the first principal surface, the entire or substantially the entire surface of the nonmagnetic resin layer.

In this structure, the effect of reducing or preventing radiation of high frequency noise produced from the surface mount device to the outside is increased.

In an electronic component according to a preferred embodiment of the present invention, the board includes a ground external terminal conductor, a metal-shield land conductor, and a first connection conductor. The ground external terminal conductor is provided on the second principal surface. The metal-shield land conductor is provided on the first principal surface and is connected to the metal shield layer. The first connection conductor extends in the magnetic body layer and connects the ground external terminal conductor and the metal-shield land conductor to each other.

In this structure, low frequency noise that passes around into the metal shield layer is reduced or prevented by a beads effect of the first connection conductor. This further reduces or prevents radiation of low frequency noise to the outside.

In an electronic component according to a preferred embodiment of the present invention, the board includes an input-output external terminal conductor and a second connection conductor. The input-output external terminal conductor is provided on the second principal surface. The second connection conductor extends along an outer side portion of the magnetic body layer and connects the input-output external terminal conductor and a terminal of the surface mount device to each other.

In this structure, since a signal that is input to and output from the surface mount device does not pass inside the magnetic body layer, transmission loss of the signal is reduced or prevented.

An electronic component according to a preferred embodiment of the present invention includes a nonmagnetic intermediate layer interposed between the metal shield layer and the magnetic shield layer.

In this structure, compared to a structure in which the magnetic shield layer and the metal shield layer abut each other, the L characteristics of the metal shield are reduced, and the noise shield effect is increased.

In an electronic component according to a preferred embodiment of the present invention, the board has a multilayer structure including the magnetic body layer and a nonmagnetic body layer disposed on two ends of the magnetic body layer in a thickness direction. The magnetic body layer is made of a magnetic ceramic, and the nonmagnetic body layer is made of a nonmagnetic ceramic.

In this structure, radiation of low frequency noise to the outside is effectively reduced or prevented. Attenuation of low frequency noise at the first connection conductor when making use of the aforementioned beads effect is increased.

In an electronic component according to a preferred embodiment of the present invention, it is preferable that the magnetic shield layer is made of a resin containing magnetic body powder.

In this structure, radiation of low frequency noise and radiation of high frequency noise are effectively reduced or prevented.

In an electronic component according to a preferred embodiment of the present invention, it is preferable that, in a low frequency region, a magnetic permeability of the magnetic body layer is higher than a magnetic permeability of the magnetic shield layer, and, in a high frequency region, the magnetic permeability of the magnetic shield layer is higher than the magnetic permeability of the magnetic body layer.

In this structure, radiation of low frequency noise and radiation of high frequency noise are effectively reduced or prevented.

In an electronic component according to a preferred embodiment of the present invention, it is preferable that a plurality of the surface mount devices are provided, and the nonmagnetic resin layer that covers the plurality of the surface mount devices is a single layer.

In this structure, the nonmagnetic resin layer is easily provided when there are a plurality of the surface mount devices.

According to preferred embodiments of the present invention, it is possible to effectively reduce or prevent radiation of low frequency noise from the electronic components.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

Figure 1:
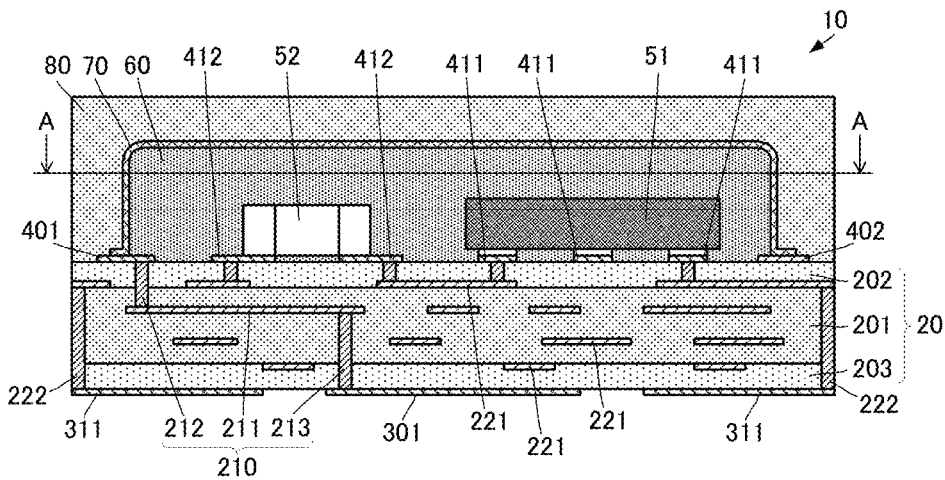
FIG. 1 is a side sectional view of an electronic component according to a first preferred embodiment of the present invention.
Figure 2:
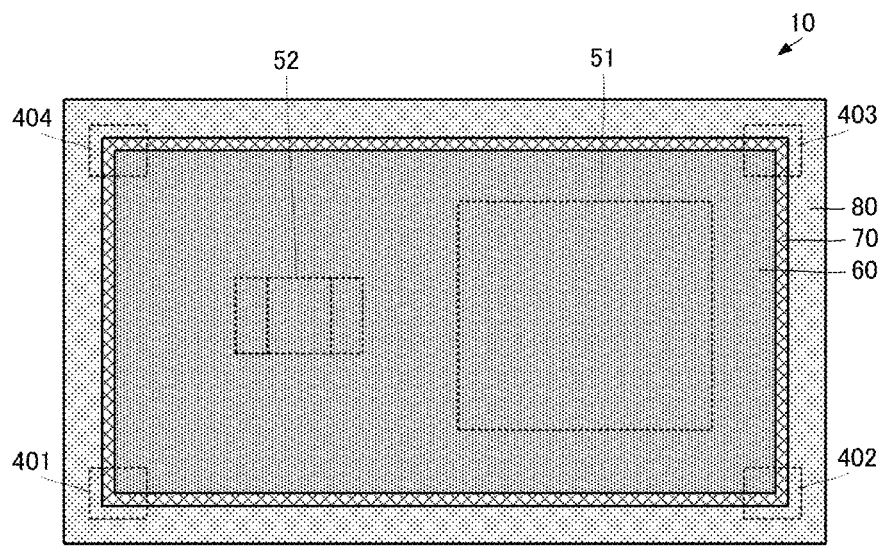
FIG. 2 is a plan sectional view of the electronic component according to the first preferred embodiment of the present invention.

An electronic component according to a first preferred embodiment of the present invention is described with reference to the drawings. FIG. 1 is a side sectional view of the electronic component according to the first preferred embodiment of the present invention. FIG. 2 is a plan sectional view of the electronic component according to the first preferred embodiment of the present invention. FIG. 2 is a sectional view along A-A of FIG. 1. Note that, in FIG. 1, in order to make it easier to identify the structures of the electronic component, symbols for identifying structural elements are not added as appropriate.

As shown in FIGS. 1 and 2, an electronic component 10 includes a board 20, surface mount devices 51 and 52, a nonmagnetic resin layer 60, a metal shield layer 70, and a magnetic shield layer 80.

The board 20 (for example, having a plate shape) includes a first principal surface and a second principal surface facing each other. The board 20 includes a magnetic body layer 201 and nonmagnetic body layers 202 and 203. The nonmagnetic body layer 202 abuts a first-principal-surface side of the magnetic body layer 201, and the nonmagnetic body layer 203 abuts a second-principal-surface side of the magnetic body layer 201. In other words, the nonmagnetic body layer 202 and the nonmagnetic body layer 203 are arranged with the magnetic body layer 201 interposed therebetween in a thickness direction of the magnetic body layer 201 (a thickness direction of the board 20). The magnetic body layer 201 is preferably made of a magnetic ceramic and the nonmagnetic body layers 202 and 203 are each preferably made of a nonmagnetic ceramic, for example.

For example, conductor patterns 221 and interlayer connection conductors are provided at the magnetic body layer 201 and the nonmagnetic body layers 202 and 203. Each conductor pattern 221 extends in a direction orthogonal or substantially orthogonal to the thickness direction, and each interlayer connection conductor extends in a direction parallel or substantially parallel to the thickness direction. The conductor patterns 221 and the interlayer connection conductors are provided as appropriate in accordance with a circuit of the board 20.

Component land conductors 411 and 412 and metal-shield land conductors 401, 402, 403, and 404 are provided on a surface of the nonmagnetic body layer 202 on a side opposite to a surface thereof that abuts upon the magnetic body layer 201, that is, on the first principal surface of the board 20. The component land conductors 411 and 412 and the metal-shield land conductors 401, 402, 403, and 404 are each preferably rectangular or substantially rectangular in plan view. Note that the shapes of the component land conductors 411 and 412 and the shapes of the metal-shield land conductors 401, 402, 403, and 404 are not limited to rectangular or substantially rectangular shapes.

The metal-shield land conductors 401, 402, 403, and 404 are each provided near a corresponding one of the four corners of the first principal surface. In plan view of the first principal surface, the component land conductors 411 and 412 are provided in a region surrounded by the metal-shield land conductors 401, 402, 403, and 404.

A ground external terminal conductor 301 and an input-output external terminal conductor 311 are provided on a surface of the nonmagnetic body layer 203 on a side opposite to a surface thereof that abuts upon the magnetic body layer 201, that is, the second principal surface of the board 20. The ground external terminal conductor 301 is provided in a central portion in plan view of the board 20, and the input-output external terminal conductor 311 is provided near side surfaces of the second principal surface. Note that, although it is possible to change the positions thereof as appropriate in terms of design, it is preferable that the input-output external terminal conductor 311 is disposed near the side surfaces of the second principal surface. Although not illustrated, when the surface mount device 51 includes a ground terminal, the ground terminal is connected to the ground external terminal conductor 301.

A conductor pattern 211 and interlayer connection conductors 212 and 213 are provided at the board 20. The conductor pattern 211 is provided in the magnetic body layer 201 and extends in a direction orthogonal or substantially orthogonal to the thickness direction. The interlayer connection conductor 212 is provided at the magnetic body layer 201 and the nonmagnetic body layer 202 and extends in a direction parallel or substantially parallel to the thickness direction. The interlayer connection conductor 212 connects the conductor pattern 211 and the metal-shield land conductor 401 to each other. The interlayer connection conductor 213 is provided at the magnetic body layer 201 and the nonmagnetic body layer 203 and extends in a direction parallel or substantially parallel to the thickness direction. The interlayer connection conductor 213 connects the conductor pattern 211 and the ground external terminal conductor 301 to each other. The conductor pattern 211 and the interlayer connection conductors 212 and 213 define a connection conductor 210 that connects the metal-shield land conductor 401 and the ground external terminal conductor 301 to each other. In this manner, the connection conductor 210 is a conductor pattern that extends in the magnetic body layer 201. The connection conductor 210 corresponds to "first connection conductor". Note that the conductor pattern 211 may be provided in the nonmagnetic body layer 202 and/or 203.

A connection conductor 222 is provided at the board 20. The connection conductor 222 extends in the thickness direction along the side surfaces of the board 20. Accordingly, the connection conductor 222 is a conductor pattern extending along an outer side portion of the magnetic body layer 201. The connection conductor 222 corresponds to "second connection conductor". The connection conductor 222 is connected to the input-output external terminal conductor 311, and the input-output external terminal conductor 311 is connected to the component land conductors 411 and 412. The component land conductors 411 and 412 to which the connection conductor 222 is connected are determined by a circuit structure of the electronic component 10.

The surface mount device 51 is joined to the component land conductors 411, and the surface mount device 52 is joined to the component land conductors 412. That is, the surface mount devices 51 and 52 are mounted on the first principal surface of the board 20.

The nonmagnetic resin layer 60 covers the surface mount devices 51 and 52.

The metal shield layer 70 covers the entire or substantially the entire surface of the nonmagnetic resin layer 60 and is connected to the metal-shield land conductors 401, 402, 403, and 404.

The magnetic shield layer 80 covers the metal shield layer 70 and the first principal surface of the board 20 in their entirety. The magnetic shield layer 80 not only covers the entire or substantially the entire surface of the metal shield layer 70 but also, in plan view of the board 20, covers portions of the metal-shield land conductors 401, 402, 403, and 404 that protrude outward of the metal shield layer 70. The magnetic shield layer 80 is preferably made of, for example, a resin containing magnetic powder (magnetic-powder-containing resin).

Figure 3:
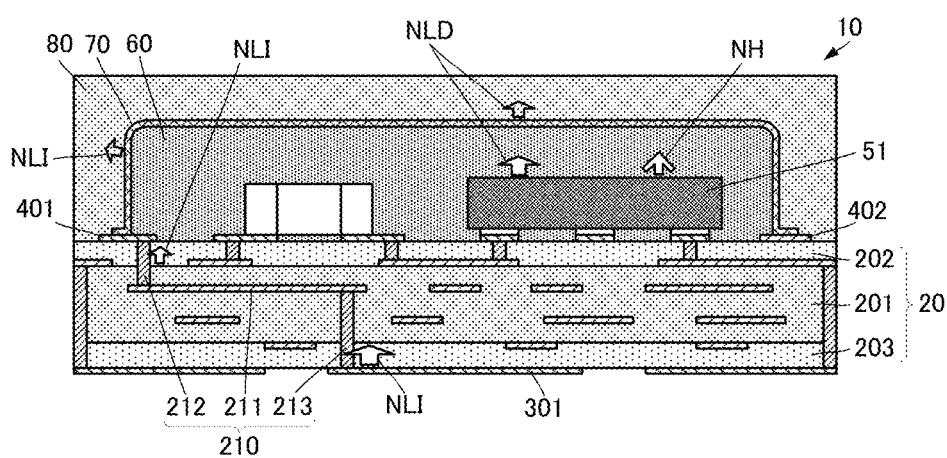
FIG. 3 illustrates a concept of reducing or preventing radiation of noise to the outside in the electronic component according to the first preferred embodiment of the present invention.

Due to such a structure, the electronic component 10 reduces or prevents radiation of noise produced from the surface mount devices to the outside as follows. FIG. 3 illustrates a concept of reducing or preventing radiation of noise to the outside in the electronic component according to the first preferred embodiment of the present invention. Note that, although FIG. 3 shows a state in which radiation of noise produced by the surface mount device 51 to the outside is reduced or prevented, similar advantageous operational effects are also obtained in the other surface mount device.

As shown in FIG. 3, when a high frequency noise NH is radiated from the surface mount device 51, the high frequency noise NH propagates through the nonmagnetic resin layer 60 and reaches the metal shield layer 70. Since the metal shield layer 70 causes the high frequency noise NH to fall to ground, the high frequency noise NH that is radiated outward of the metal shield layer 70 is reduced or prevented.

As shown in FIG. 3, when a low frequency noise NLD is radiated from the surface mount device 51, the low frequency noise NLD propagates through the nonmagnetic resin layer 60 and the metal shield layer 70 and reaches the magnetic shield layer 80. Since the magnetic shield layer 80 attenuates the low frequency noise NLD, the low frequency noise NLD that is radiated outward of the magnetic shield layer 80 is reduced or prevented.

As shown in FIG. 3, the magnetic shield layer 80 is disposed on the entire or substantially the entire upper surface and the entire or substantially the entire side surfaces of the surface mount device 51, and the magnetic body layer 201 is disposed below the surface mount device 51. In this manner, since the surface mount device 51 is surrounded by magnetic bodies, radiation of low frequency noise produced from the surface mount device 51 to the outside is reduced or prevented.

Further, by the following principle, the electronic component 10 reduces or prevents low frequency noise that passes around from ground and that is radiated to the outside.

Figure 4:
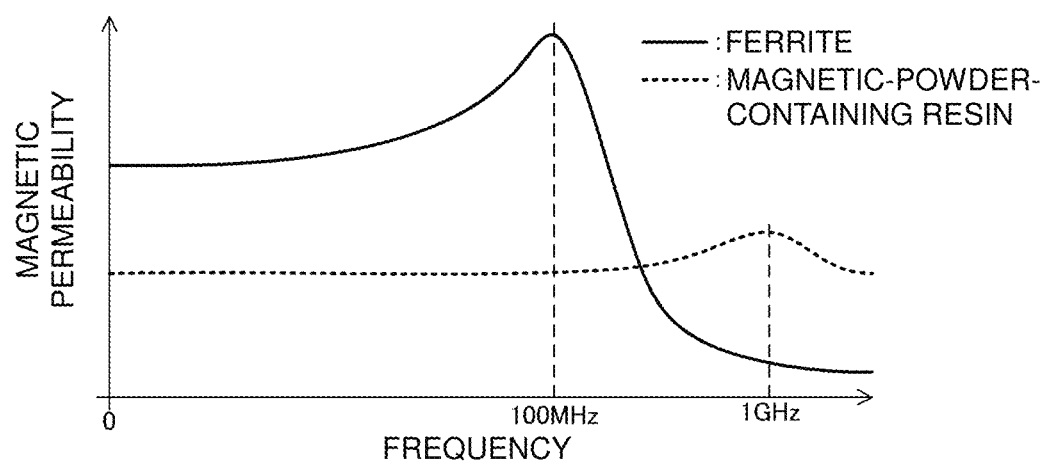
FIG. 4 is a graph showing frequency characteristics of magnetic permeabilities of ferrite and magnetic-body-powder-containing resin.

FIG. 4 is a graph showing frequency characteristics of magnetic permeabilities of ferrite and magnetic-body-powder-containing resin. In FIG. 4, a frequency band lower than about 100 MHz is a low frequency region, and a frequency band higher than about 100 MHz is a high frequency region, for example. The threshold between the high frequency region and the low frequency region is not limited to about 100 MHz and is set on the order of a few hundred MHz. In the case of, for example, a power supply circuit, the threshold is set based on a switching frequency of a switching IC of the power supply circuit.

As shown in FIG. 4, the magnetic permeability of ferrite is high in the low frequency region and is suddenly reduced in the high frequency region. On the other hand, although variations in the magnetic permeability of magnetic-body-powder-containing resin according to the frequency are small, the magnetic permeability of magnetic-body-powder-containing resin is higher in the high frequency region than in the low frequency region and reaches a peak in the high frequency region.

In the electronic component 10, a ferrite, that is, a magnetic ceramic defines the magnetic body layer 201. Therefore, low frequency noise radiated towards a low surface of the surface mount device 51 is effectively attenuated by the magnetic body layer 201.

Further, by the beads effect, in the low frequency region, loss at the connection conductor 210 is increased. Therefore, as shown in FIG. 3, a low frequency noise NLI that has passed around via the ground external terminal conductor 301 is greatly attenuated at the connection conductor 210 and is reduced when the low frequency noise NLI reaches the metal shield layer 70. Consequently, the low frequency noise radiated towards the magnetic shield layer 80 from the metal shield layer 70 is reduced and is further attenuated at the magnetic shield layer 80, thus further reducing or preventing radiation to the outside.

On the other hand, loss at the ferrite, that is, a magnetic ceramic is small at a high frequency, and high frequency noise propagated to the metal shield layer 70 is effectively propagated to the ground external terminal conductor 301 and falls to ground.

The magnetic-body-powder-containing resin defines the magnetic shield layer 80. Therefore, the magnetic shield layer 80 attenuates low frequency noise in a wide frequency band. Consequently, it is possible to attenuate the low frequency noise regardless of the frequency of the low frequency noise. Since the magnetic shield layer 80 provides an attenuation effect even in the high frequency region, the magnetic shield layer 80 is also capable of assisting in the reduction or prevention of radiation of high frequency noise to the outside.

In the low frequency region, the magnetic permeability of ferrite is preferably higher than the magnetic permeability of magnetic-body-powder-containing resin, and, in the high frequency region, the magnetic permeability of magnetic-body-powder-containing resin is preferably higher than the magnetic permeability of ferrite. Therefore, if the frequency of noise that has passed around from the ground external terminal conductor 301 is low, the noise is able to be effectively attenuated at the magnetic body layer 201 and, even if the frequency of the noise that has passed around from the ground external terminal conductor 301 is high, the noise is able to be attenuated at the magnetic shield layer 80.

Consequently, the electronic component 10 is capable of effectively reducing or preventing radiation of noise to the outside independently of the frequency of the noise.

In the electronic component 10, the connection conductor 222 is not surrounded by the magnetic body layer 201. Therefore, loss caused by the magnetic body layer 201 with respect to a signal input to and output from the surface mount devices 51 and 52 is reduced or prevented. Consequently, it is possible to obtain the electronic component 10 having a good signal transmission efficiency.

The electronic component having such a structure may be manufactured by the following non-limiting example of a manufacturing method. FIGS. 5A to 5C and 6A to 6C are each a side sectional view showing a state in a corresponding manufacturing process of the electronic component according to the present preferred embodiment.

Figure 5A:
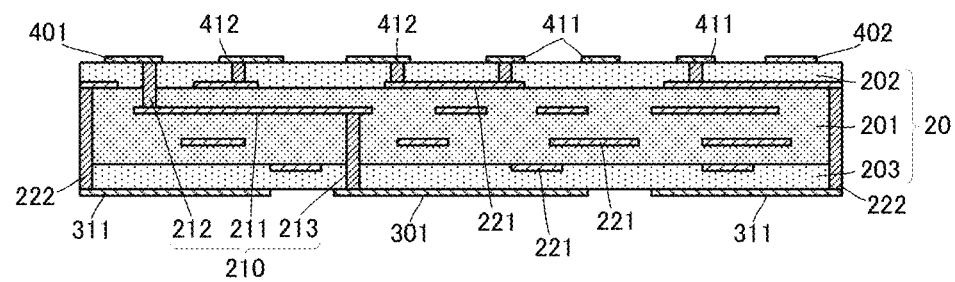
FIGS. 5A to 5C are each a side sectional view showing a state of an electronic component according to a preferred embodiment of the present invention in a corresponding manufacturing process.

First, as shown in FIG. 5A, the board 20 is formed. The board 20 is manufactured by a known method of manufacturing a multilayer board including a multilayer body including the magnetic body layer 201, made of a magnetic ceramic, and the nonmagnetic body layers 202 and 203, made of a nonmagnetic ceramic.

Figure 5B:
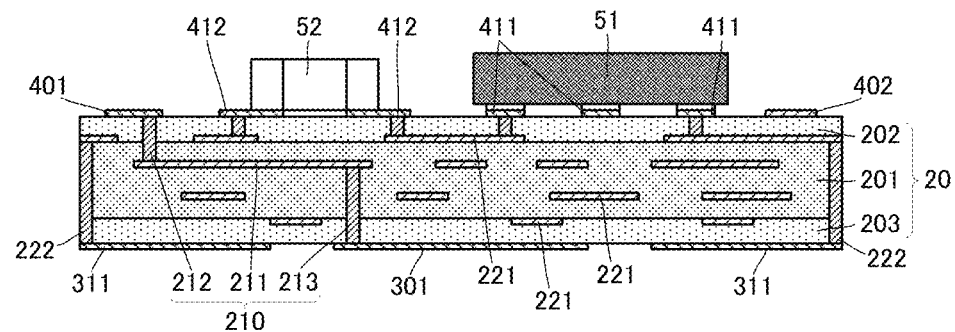

Next, as shown in FIG. 5B, the surface mount device 51 is joined to the component land conductors 411 on the board 20, and the surface mount device 52 is joined to the component land conductors 412. These may be joined by, for example, using a brazing material, such as a solder, or using ultrasonic waves.

Figure 5C:
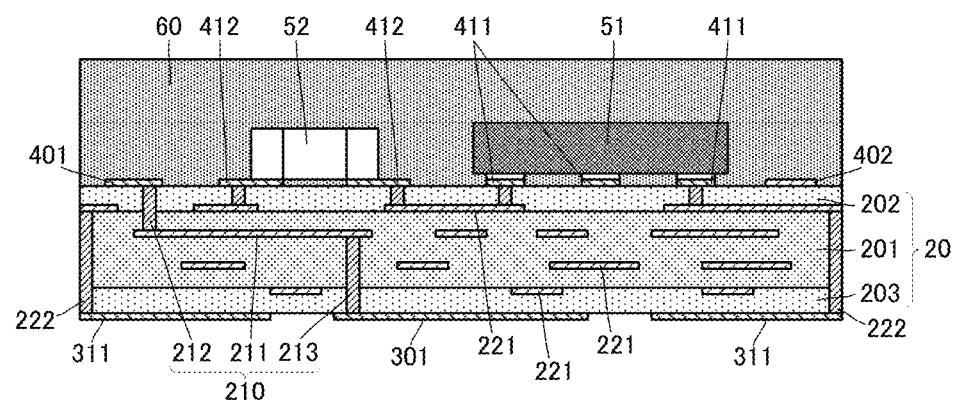

Next, as shown in FIG. 5C, the nonmagnetic resin layer 60 is formed on the first principal surface of the board 20. The nonmagnetic resin layer 60 is formed by, for example, a method of applying and solidifying a nonmagnetic resin material.

Figure 6A:
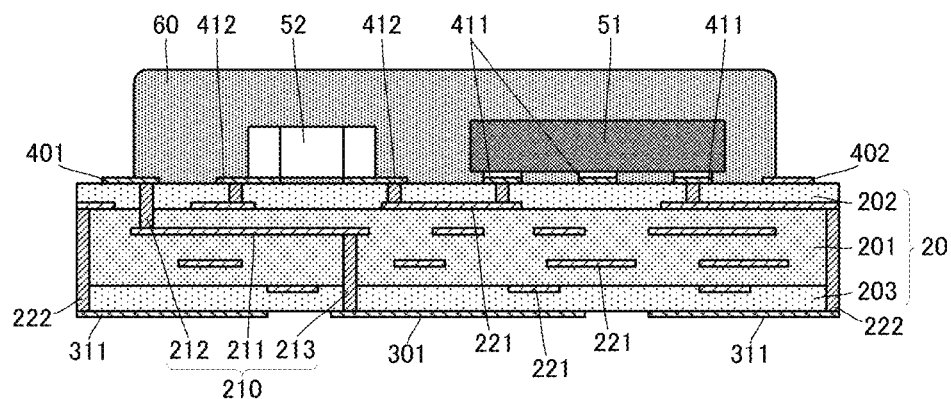
FIGS. 6A to 6C are each a side sectional view showing a state of an electronic component according to a preferred embodiment of the present invention in a corresponding manufacturing process.

Next, as shown in FIG. 6A, the nonmagnetic resin layer 60 is ground. Here, a portion of the nonmagnetic resin layer 60 from side surfaces thereof to an inner side at a predetermined distance is ground. By this processing, the metal-shield land conductors 401 and 402 are exposed on the side of the first principal surface of the board 20.

Figure 6B:
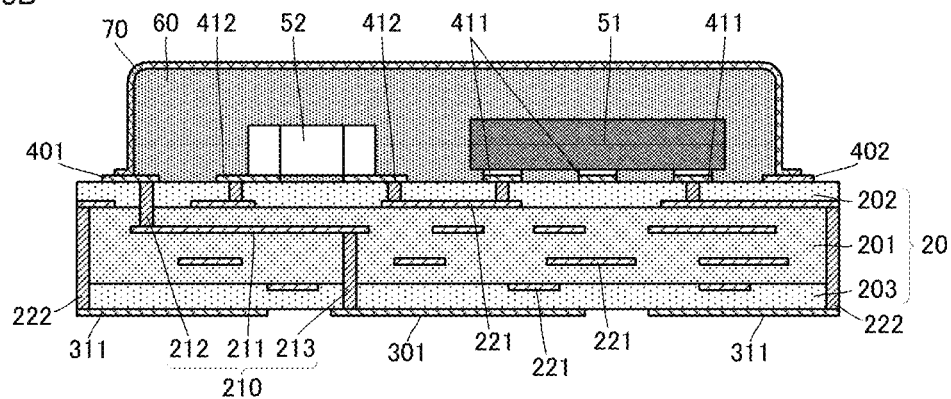

Next, as shown in FIG. 6B, the metal shield layer 70 is formed on the entire or substantially the entire upper surface and side surfaces of the nonmagnetic resin layer 60, on at least a portion of a surface of the metal-shield land conductor 401, and on at least a portion of a surface of the metal-shield land conductor 402. The metal shield layer 70 is formed by, for example, sputtering. Therefore, the metal shield layer 70 that covers the entire or substantially the entire upper surface and side surfaces of the nonmagnetic resin layer 60 and that is connected to the metal-shield land conductors 401 and 402 is formed.

Figure 6C:
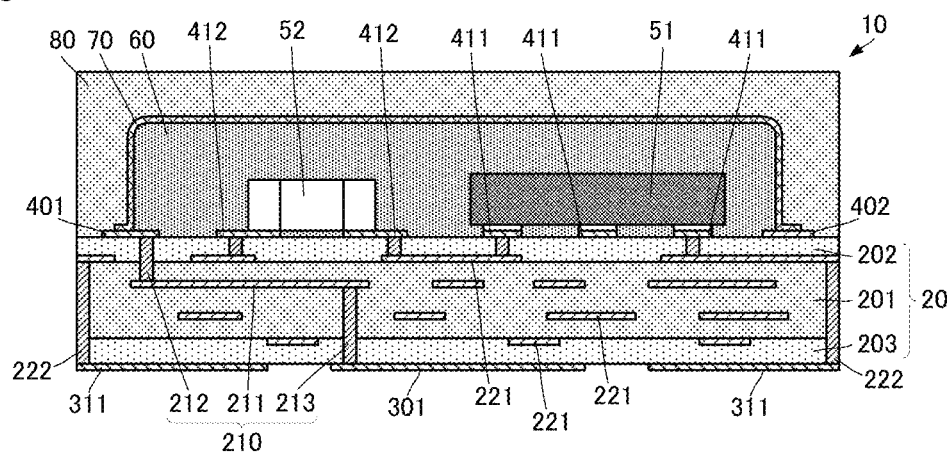

Next, as shown in FIG. 6C, the magnetic shield layer 80 is formed so as to cover the entire or substantially the entire upper surface and side surfaces of the metal shield layer 70 and cover an exposed portion of the first principal surface of the board 20. The magnetic shield layer 80 is formed by, for example, a method of applying and solidifying a magnetic-body-powder-containing resin.

By using such a manufacturing method, it is possible to manufacture the electronic component 10 in which radiation of noise to the outside is reduced or prevented.

Figure 7:
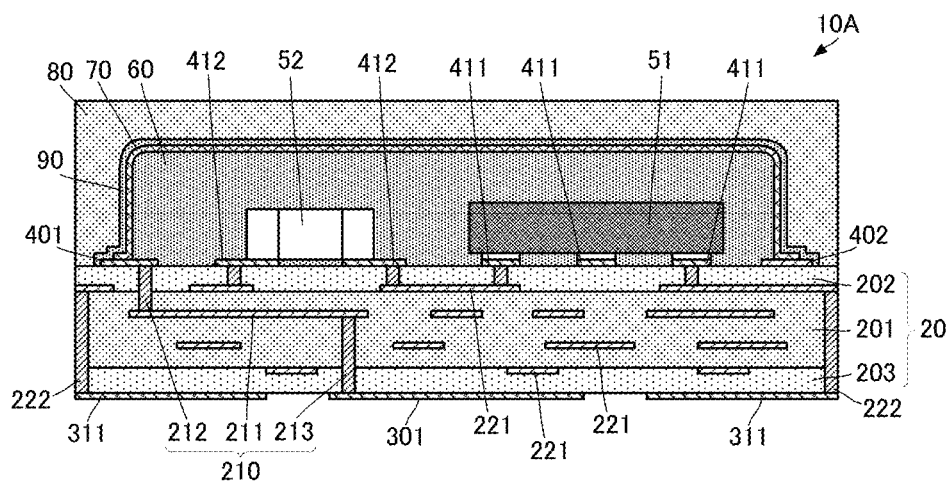
FIG. 7 is a side sectional view of an electronic component according to a second preferred embodiment of the present invention.

Next, an electronic component according to a second preferred embodiment of the present invention is described with reference to the drawings. FIG. 7 is a side sectional view of the electronic component according to the second preferred embodiment of the present invention.

As shown in FIG. 7, an electronic component 10A according to the second preferred embodiment differs from the electronic component 10 according to the first preferred embodiment in that an intermediate layer 90 is included. The remaining structure of the electronic component 10A is the same as or similar to that of the electronic component 10, and similar portions are not described.

The intermediate layer 90 is a nonmagnetic body and is disposed between a metal shield layer 70 and a magnetic shield layer 80. Therefore, the metal shield layer 70 is separated from the magnetic shield layer 80, and the entire or substantially the entire outer surface of the metal shield layer 70 is covered by the nonmagnetic body. Consequently, the L characteristics of the metal shield layer 70 is able to be reduced, and high frequency noise is able to be more effectively caused to flow to ground.

Figure 8:
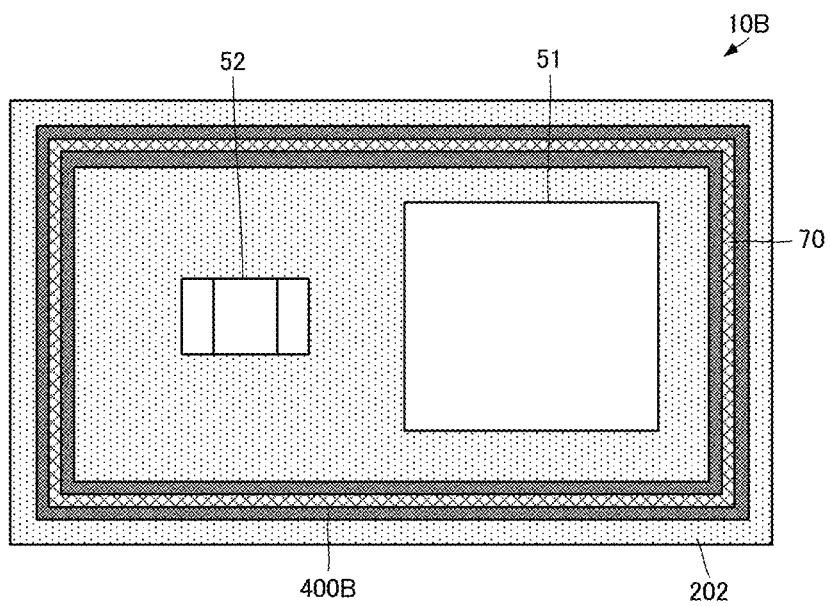
FIG. 8 is a plan sectional view showing a characteristic structure of an electronic component according to a third preferred embodiment of the present invention.

Next, an electronic component according to a third preferred embodiment of the present invention is described with reference to the drawings. FIG. 8 is a plan sectional view showing a characteristic structure of the electronic component according to the third preferred embodiment of the present invention.

As shown in FIG. 8, an electronic component 10B according to the third preferred embodiment differs from the electronic component 10 according to the first preferred embodiment in the shape of a metal-shield land conductor 400B. The remaining structure of the electronic component 10B is the same as or similar to that of the electronic component 10, and similar portions are not described.

The metal-shield land conductor 400B has a ring shape along side surfaces of a board 20 (side surfaces of a nonmagnetic body layer 202). A metal shield layer 70 is connected to the metal-shield land conductor 400B over the entire or substantially the entire periphery thereof.

Due to such a structure, an upper surface and side surfaces of each of surface mount devices 51 and 52 are completely covered by the metal shield layer 70 and the metal-shield land conductor 400B. Therefore, the effect of reducing or preventing high frequency noise is increased.

Figure 9A:
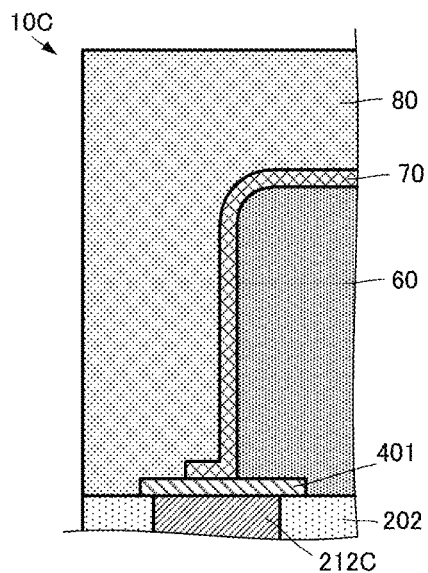
FIGS. 9A and 9B are each a partial enlarged side sectional view showing a characteristic structure of an electronic component according to a fourth preferred embodiment of the present invention.
Figure 9B:
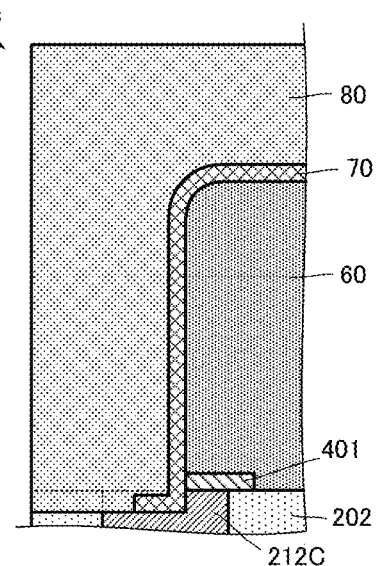

Next, an electronic component according to a fourth preferred embodiment of the present invention is described with reference to the drawings. FIGS. 9A and 9B are each a partial enlarged side sectional view showing a characteristic structure of the electronic component according to the fourth preferred embodiment of the present invention. FIGS. 9A and 9B are each an enlarged view of a portion including a metal-shield land conductor 401. FIG. 9A shows a state in which a board 20 is not shaved when grinding a nonmagnetic resin layer 60, and FIG. 9B shows a state in which the board 20 has been shaved when grinding the nonmagnetic resin layer 60.

As shown in FIGS. 9A and 9B, an electronic component 10C according to the fourth preferred embodiment differs from the electronic component 10 according to the first preferred embodiment in the shape of an interlayer connection conductor 212C. The remaining structure of the electronic component 10C is the same as or similar to that of the electronic component 10, and similar portions are not described.

The interlayer connection conductor 212C extends in a thickness direction of the board 20. In plan view of the board 20, the interlayer connection conductor 212C includes an overlap region in which the metal-shield land conductor 401 and side surfaces of the nonmagnetic resin layer 60 in a completed state as the electronic component 10 overlap each other, and extends over a region having a predetermined width from the overlap region to a side-surface side of the board 20.

Due to such a structure, as shown in FIG. 9B, when grinding the nonmagnetic resin layer 60, even if not only the nonmagnetic resin layer 60, but also a nonmagnetic body layer 202 of the board 20 has been ground to a predetermined depth, a metal shield layer 70 is connected to the side surfaces of the metal-shield land conductor 401 and the interlayer connection conductor 212C. This makes it possible to prevent electrical floating of the metal shield layer 70 and to reliably cause high frequency noise to fall to ground.

Figure 10A:
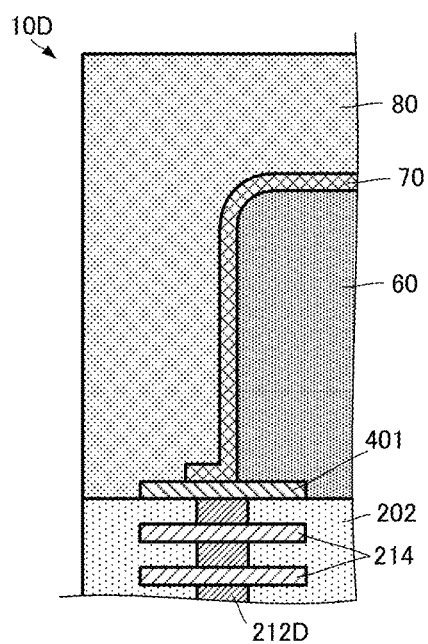
FIGS. 10A and 10B are each a partial enlarged side sectional view showing a characteristic structure of an electronic component according to a fifth preferred embodiment of the present invention.
Figure 10B:
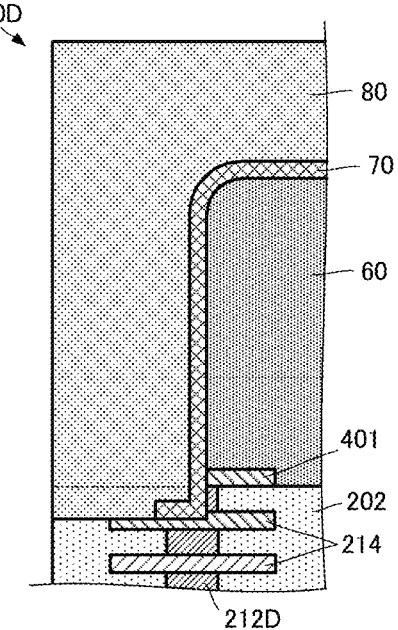

Next, an electronic component according to a fifth preferred embodiment of the present invention is described with reference to the drawings. FIGS. 10A and 10B are each a partial enlarged side sectional view showing a characteristic structure of the electronic component according to the fifth preferred embodiment of the present invention. FIGS. 10A and 10B are each an enlarged view of a portion including a metal-shield land conductor 401. FIG. 10A shows a state in which a board 20 is not shaved when grinding a nonmagnetic resin layer 60, and FIG. 10B shows a state in which the board 20 has been shaved when grinding the nonmagnetic resin layer 60.

As shown in FIGS. 10A and 10B, an electronic component 10D according to the fifth preferred embodiment differs from the electronic component 10 according to the first preferred embodiment in that it includes auxiliary conductor layers 214. The remaining structure of the electronic component 10D is the same as or similar to that of the electronic component 10, and similar portions are not described below.

The auxiliary conductor layers 214 are provided in a nonmagnetic body layer 202. In plan view, each auxiliary conductor layer 214 preferably has the same or substantially the same shape as the metal-shield land conductor 401 and overlaps the metal-shield land conductor 401. An interlayer connection conductor 212D extends in a thickness direction of the board 20. In plan view of the board 20, the interlayer connection conductor 212D includes an overlap region in which the metal-shield land conductor 401 and the auxiliary conductor layers 214 overlap side surfaces of the nonmagnetic resin layer 60 in a completed state as the electronic component 10, and extends over a region having a predetermined width from the overlap region to a side-surface side of the board 20.

Due to such a structure, as shown in FIG. 10B, when grinding the nonmagnetic resin layer 60, even if not only the nonmagnetic resin layer 60, but also a nonmagnetic body layer 202 of the board 20 has been ground to a predetermined depth, a metal shield layer 70 is connected to the side surfaces of the metal-shield land conductor 401 and to the interlayer connection conductor 212D or the interlayer connection conductor 212D and the auxiliary conductor layers 214. This makes it possible to prevent electrical floating of the metal shield layer 70 and to reliably cause high frequency noise to fall to ground.

Note that, in the above-described preferred embodiments, the nonmagnetic resin layer 60 only needs to, at the first principal surface of the board 20, cover at least the entire or substantially the entire surface of each of the surface mount devices 51 and 52. That is, the surface mount device 51 and the surface mount device 52 may be individually covered by the nonmagnetic resin layer 60. However, by covering the surface mount devices 51 and 52 with a single layer of nonmagnetic resin layer 60, it becomes easy to provide the nonmagnetic resin layer 60.

The metal shield layer 70 only needs to cover at least a desired portion (a portion at which high frequency noise is not to be radiated to the outside) of the nonmagnetic resin layer 60, and preferably covers the entire or substantially the entire surface of the nonmagnetic resin layer 60.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a board including a first principal surface and a second principal surface facing each other, and a magnetic body layer;
    a surface mount device mounted on the first principal surface of the board;
    a nonmagnetic resin layer covering, at the first principal surface, an entire or substantially an entire surface of the surface mount device;
    a metal shield layer covering, at the first principal surface, the nonmagnetic resin layer; and
    a magnetic shield layer covering, at the first principal surface, an entire or substantially an entire surface of the nonmagnetic resin layer and an entire or substantially an entire surface of the metal shield layer.

2. The electronic component according to claim 1, wherein the metal shield layer covers, at the first principal surface, the entire or substantially the entire surface of the nonmagnetic resin layer.

3. The electronic component according to claim 1, wherein
    the board includes:
        a ground external terminal conductor provided on the second principal surface;
        a metal-shield land conductor provided on the first principal surface and connected to the metal shield layer; and
        a first connection conductor extending in the magnetic body layer and connecting the ground external terminal conductor and the metal-shield land conductor to each other.

4. The electronic component according to claim 1, wherein
    the board includes:
        an input-output external terminal conductor provided on the second principal surface; and
        a second connection conductor extending along an outer side portion of the magnetic body layer and connecting the input-output external terminal conductor and a terminal of the surface mount device to each other.

5. The electronic component according to claim 1, further comprising a nonmagnetic intermediate layer interposed between the metal shield layer and the magnetic shield layer.

6. The electronic component according to claim 1, wherein
    the board has a multilayer structure including:
        the magnetic body layer; and
        a nonmagnetic body layer disposed on each of two opposed surfaces of the magnetic body layer in a thickness direction;
    the magnetic body layer is made of a magnetic ceramic; and
    the nonmagnetic body layer is made of a nonmagnetic ceramic.

7. The electronic component according to claim 1, wherein the magnetic shield layer is made of a resin containing magnetic body powder.

8. The electronic component according to claim 1, wherein
    in a low frequency region, a magnetic permeability of the magnetic body layer is higher than a magnetic permeability of the magnetic shield layer; and
    in a high frequency region, the magnetic permeability of the magnetic shield layer is higher than the magnetic permeability of the magnetic body layer.

9. The electronic component according to claim 1, wherein
    a plurality of the surface mount devices are provided; and
    the nonmagnetic resin layer that covers the plurality of the surface mount devices is a single layer.

10. The electronic component according to claim 6, wherein the nonmagnetic body layers abut each of two opposed surfaces of the magnetic body layer in a thickness direction.

11. The electronic component according to claim 3, wherein the metal-shield land conductor has a rectangular or substantially rectangular shape.

12. The electronic component according to claim 3, wherein
    a plurality of the metal-shield land conductors are provided; and
    each of the plurality of metal-shield land conductors is disposed near a corresponding one of four corners of the first principal surface.

13. The electronic component according to claim 3, wherein the first connection conductor includes a conductor pattern provided in the board and extending in a direction orthogonal or substantially orthogonal to a thickness direction, and an interlayer connection conductor provided in the board and extending in a direction parallel or substantially parallel to the thickness direction.

14. The electronic component according to claim 4, wherein the second connection conductor includes a conductor pattern provided in the board and extending in a direction orthogonal or substantially orthogonal to a thickness direction, and an interlayer connection conductor provided in the board and extending in a direction parallel or substantially parallel to the thickness direction.

15. The electronic component according to claim 5, wherein the nonmagnetic intermediate layer covers the entire or substantially the entire surface of the metal shield layer.

16. The electronic component according to claim 3, wherein the metal-shield land conductor has a ring shape extending along side surfaces of the board.

17. The electronic component according to claim 16, wherein the metal shield layer is connected to the metal-shield land conductor over an entire or substantially an entire periphery thereof.

18. The electronic component according to claim 13, wherein the interlayer connection conductor includes an overlap region in which the metal-shield land conductor and side surfaces of the nonmagnetic resin layer overlap each other.

* * * * *